(12) United States Patent
Wong

(10) Patent No.: US 7,741,910 B2
(45) Date of Patent: Jun. 22, 2010

(54) CAPACITOR GAIN-BOOST CIRCUIT

(76) Inventor: Louis Sze Wong, 1070 Lois Ave., Sunnyvale, CA (US) 94087

(*) Notice: Subject to any disclaimer, the term of this patent is extended or adjusted under 35 U.S.C. 154(b) by 0 days.

(21) Appl. No.: 11/971,913

(22) Filed: Jan. 10, 2008

(65) Prior Publication Data
US 2009/0179706 A1    Jul. 16, 2009

(51) Int. Cl.
H03F 3/45 (2006.01)
H03F 1/22 (2006.01)

(52) U.S. Cl. .................................... 330/260; 330/311
(58) Field of Classification Search ............. 330/253, 330/260, 311
See application file for complete search history.

(56) References Cited

U.S. PATENT DOCUMENTS

| | | | |
|---|---|---|---|
| 6,114,907 A * | 9/2000 | Sakurai | 330/253 |
| 6,362,688 B1 | 3/2002 | Au | |
| 6,828,856 B2 | 12/2004 | Sanchez et al. | |

* cited by examiner

Primary Examiner—Steven J Mottola

(57) ABSTRACT

A circuit is disclosed that comprises a capacitor gain-boost circuit and an amplifier coupled to capacitor gain-boost circuit. A capacitor gain-boost circuit comprises of capacitor, gain-boost amplifier and biasing circuit. The gain-boost amplifier and capacitor provides optimum biasing operation and performance. Accordingly, through the use of capacitor gain-boost circuit, the supply voltage range and power consumption of an amplifier is optimized while the gain of amplifier is improved.

11 Claims, 12 Drawing Sheets

Capacitor gain-boost circuits implement on complementary stage amplifier

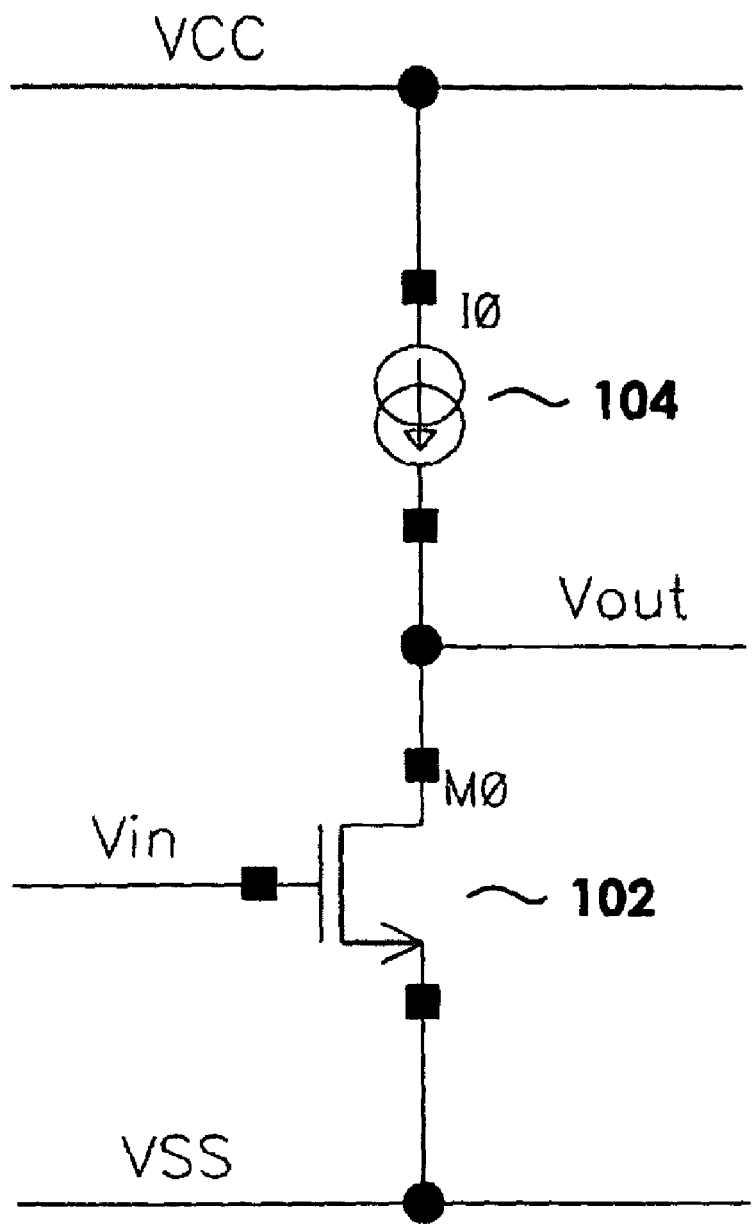
Figure 1. A single-stage voltage amplifier for illustration

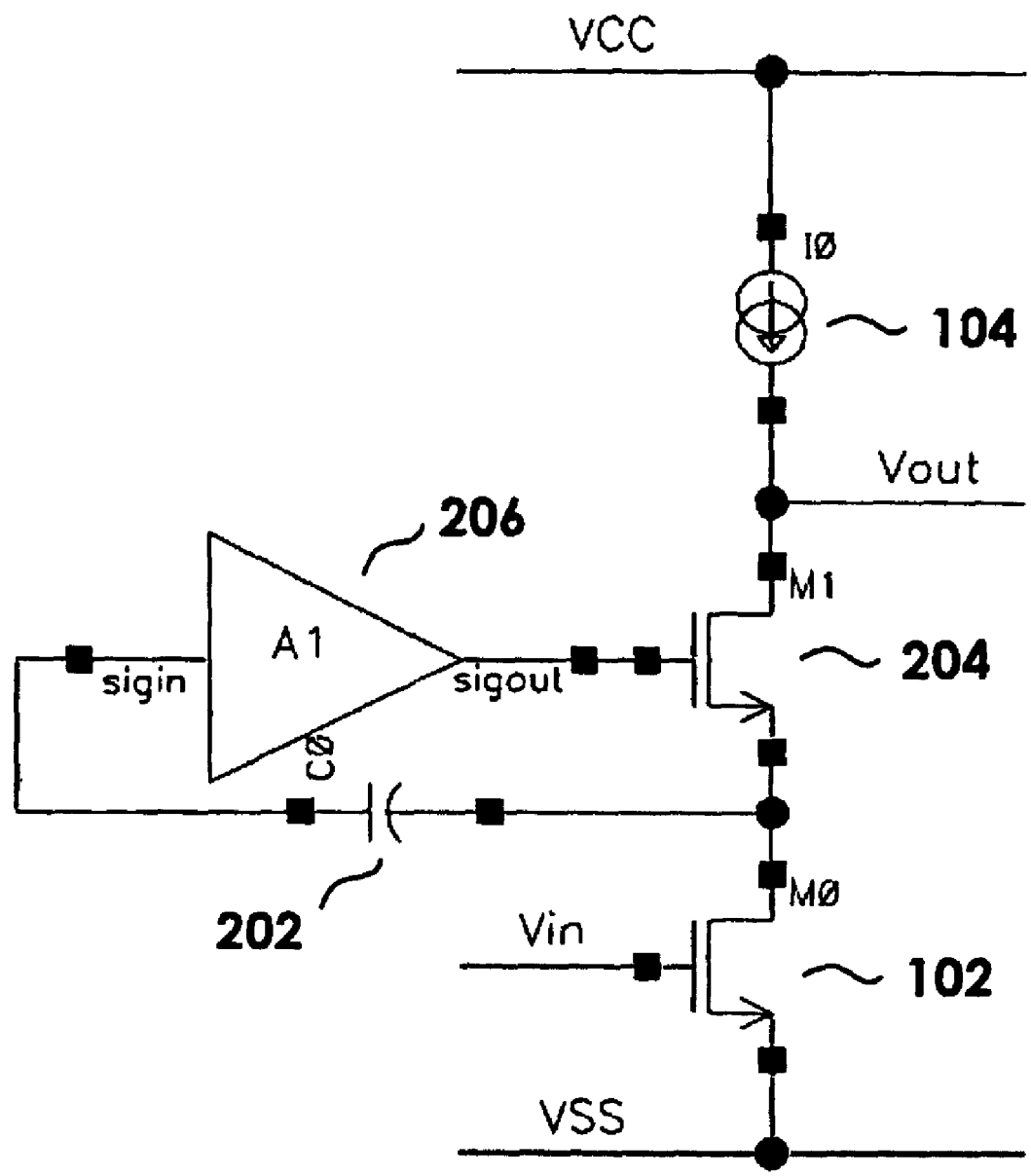
Figure 2. Capacitor gain-boost circuit

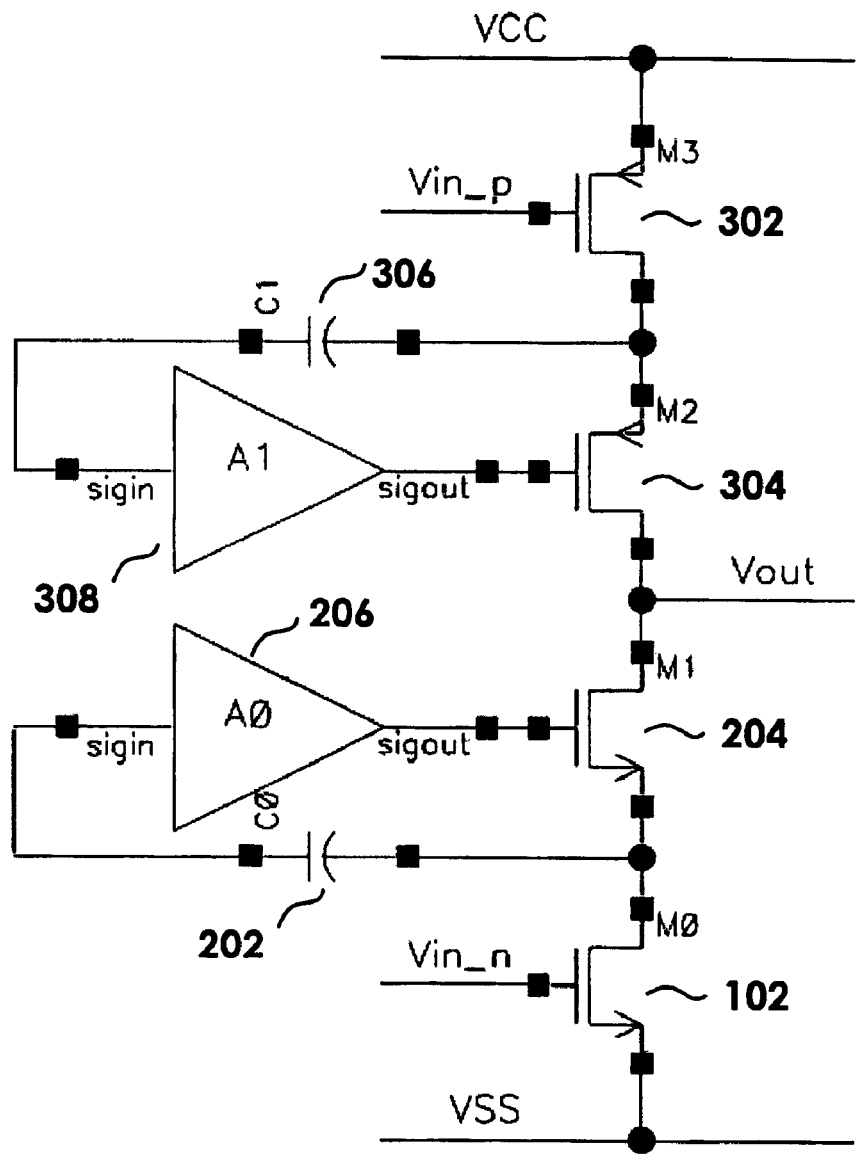
Figure 3. Capacitor gain-boost circuits implement on complementary stage amplifier

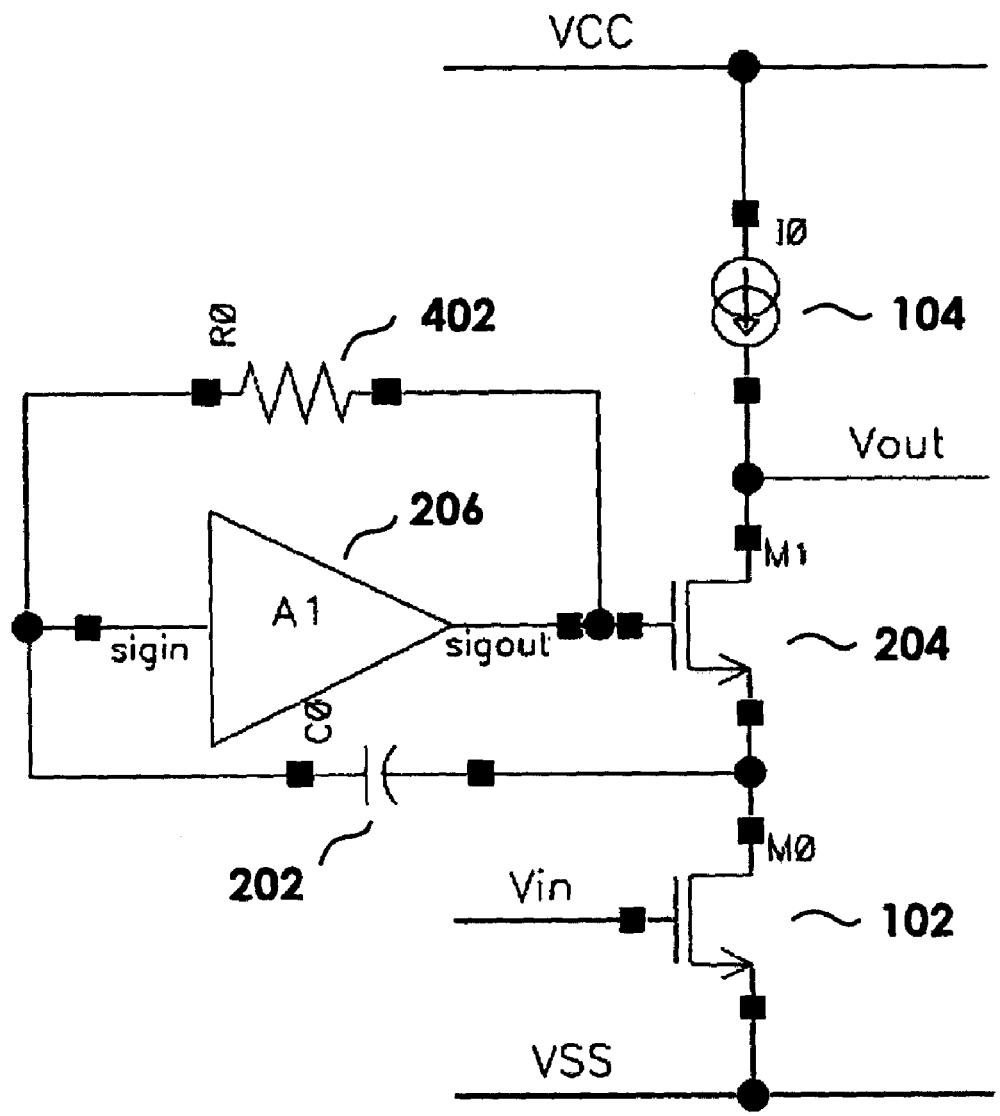
Figure 4. Capacitor gain-boost circuit in a bias condition

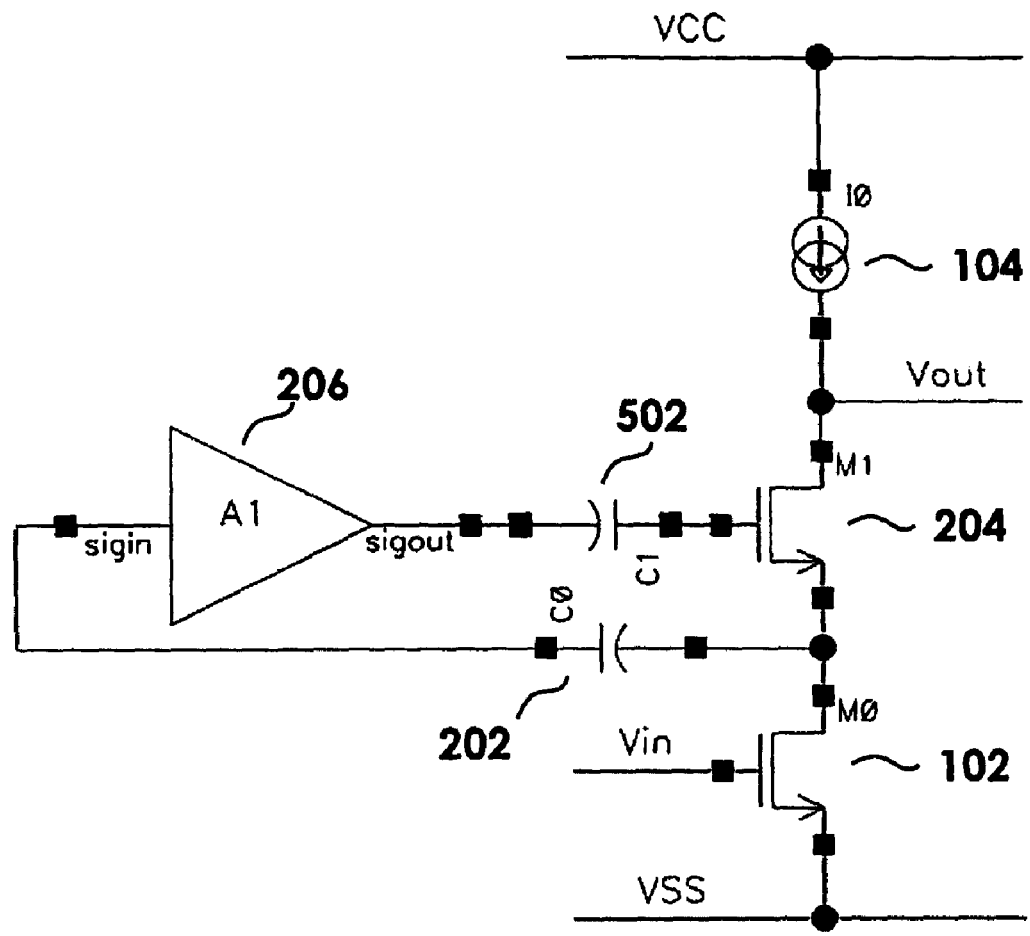
Figure 5. Dual-capacitor gain-boost circuit

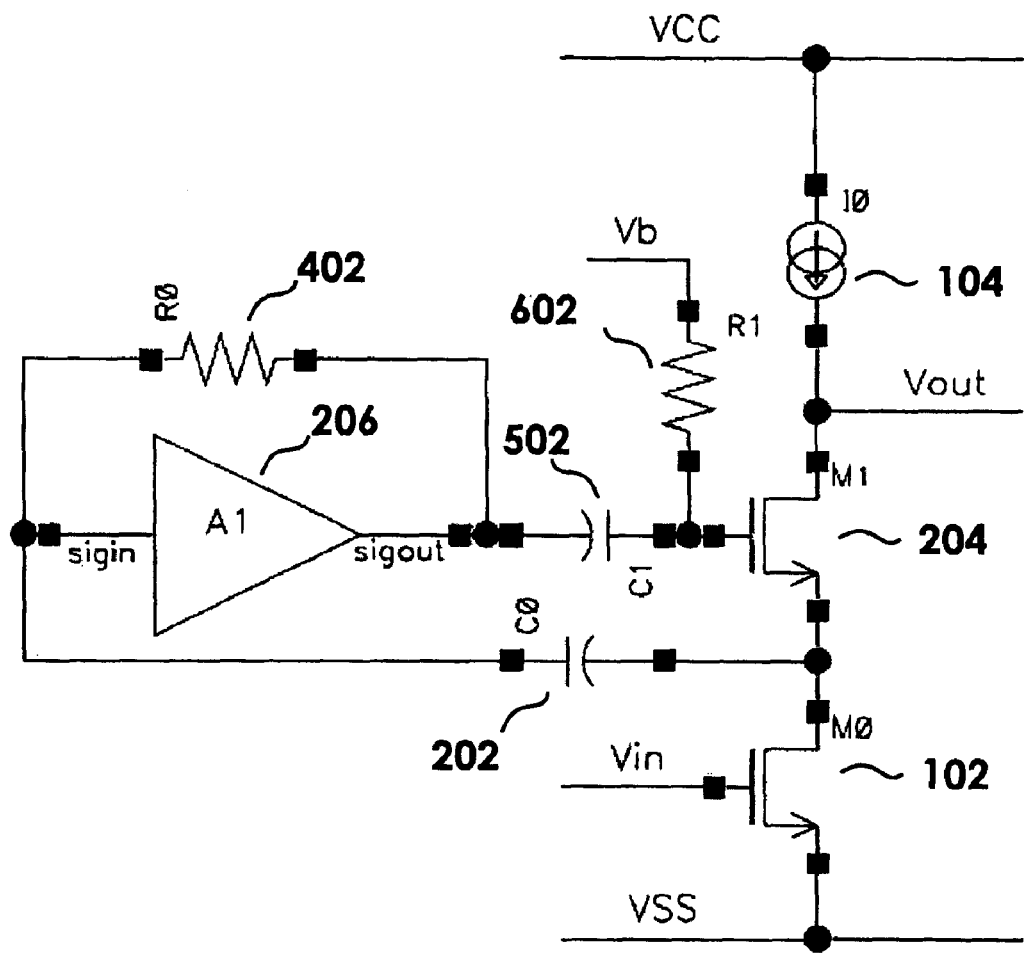
Figure 6. Dual-capacitor gain-boost circuit in a bias condition

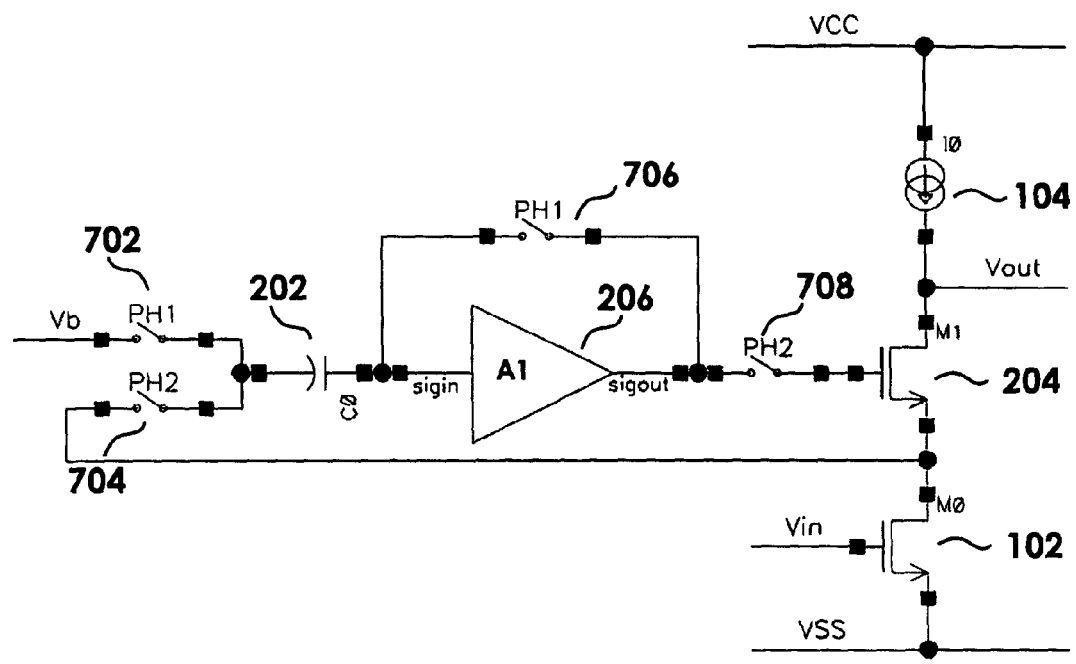
Figure 7. Switched-capacitor gain-boost circuit

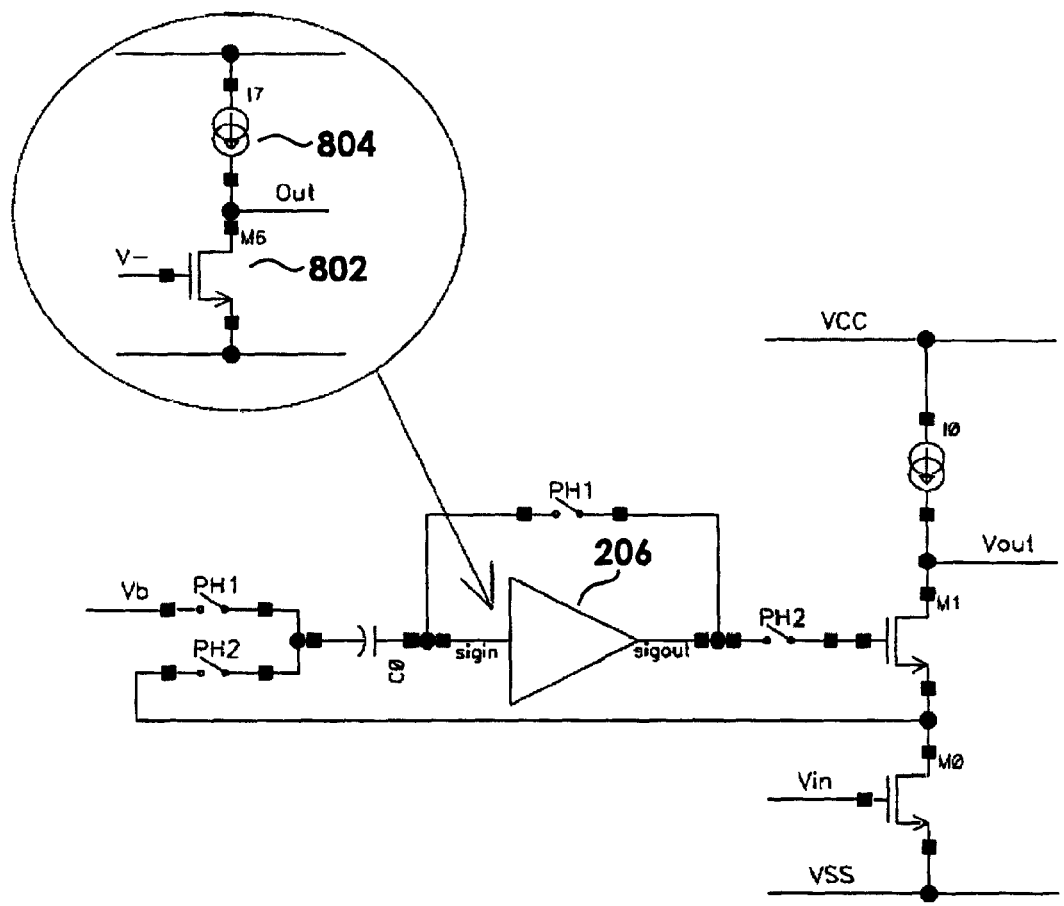
Figure 8. An example implementation of gain-boost circuit

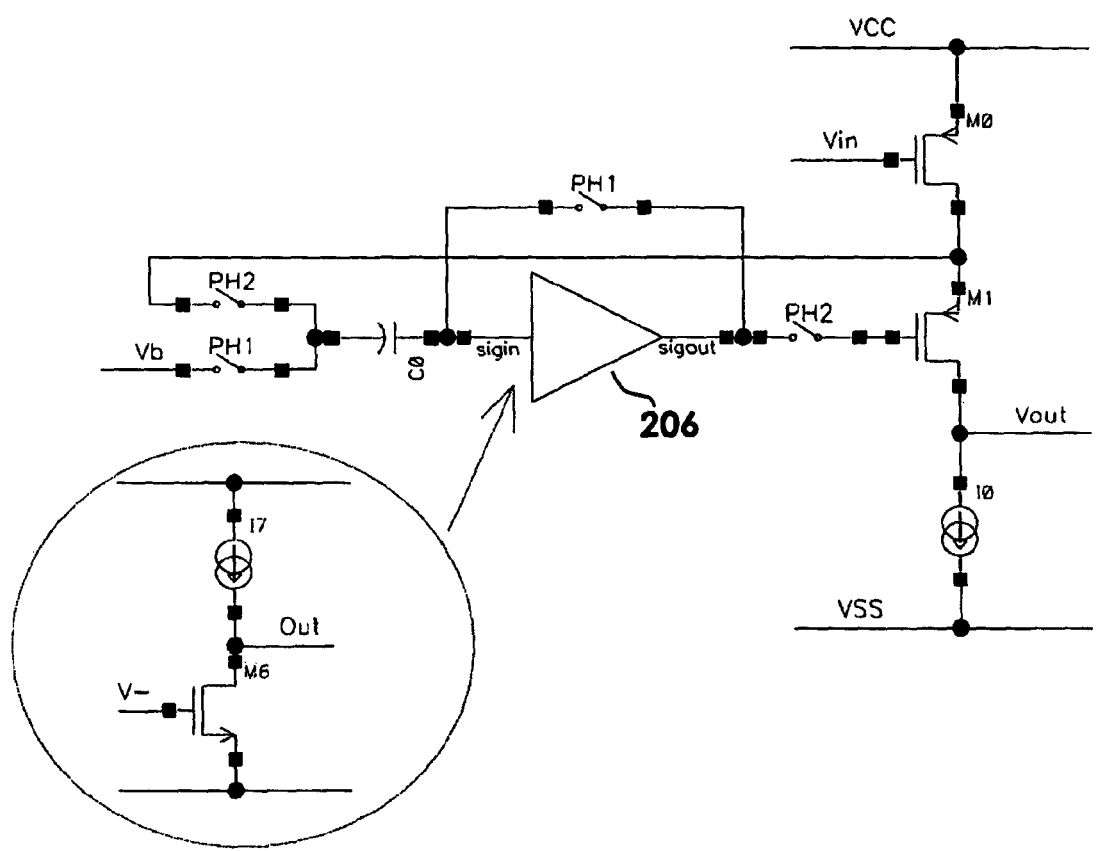
Fig. 9. Gain-boost circuit in a p-channel amplifier arrangement

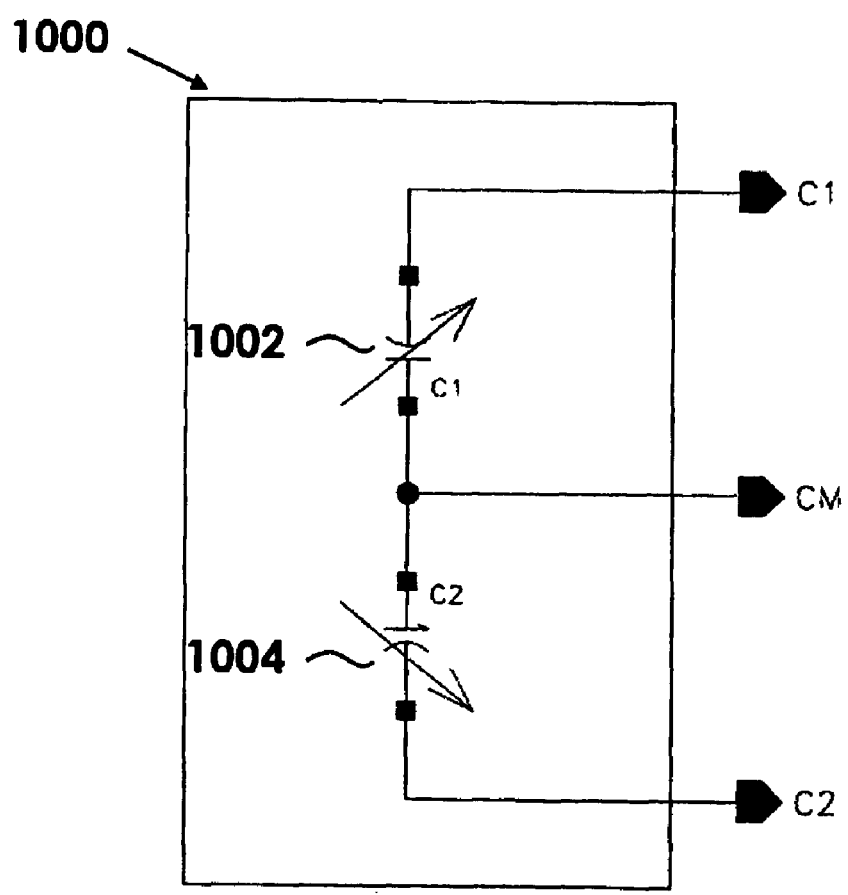
Figure 10. A capacitive MEMS sensor electrical equivalent model

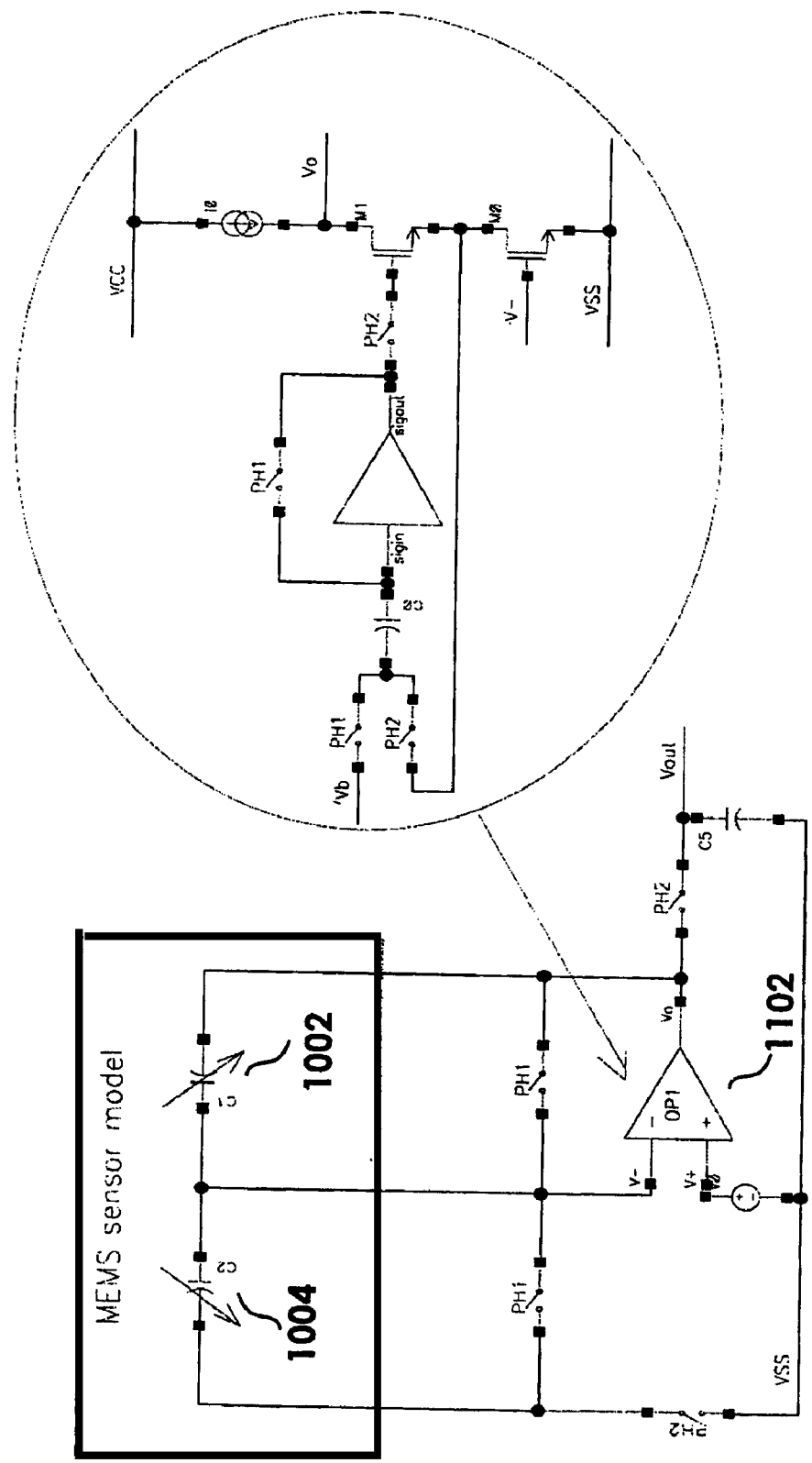
Figure 11. An application example for capacitive MEMS interface circuit

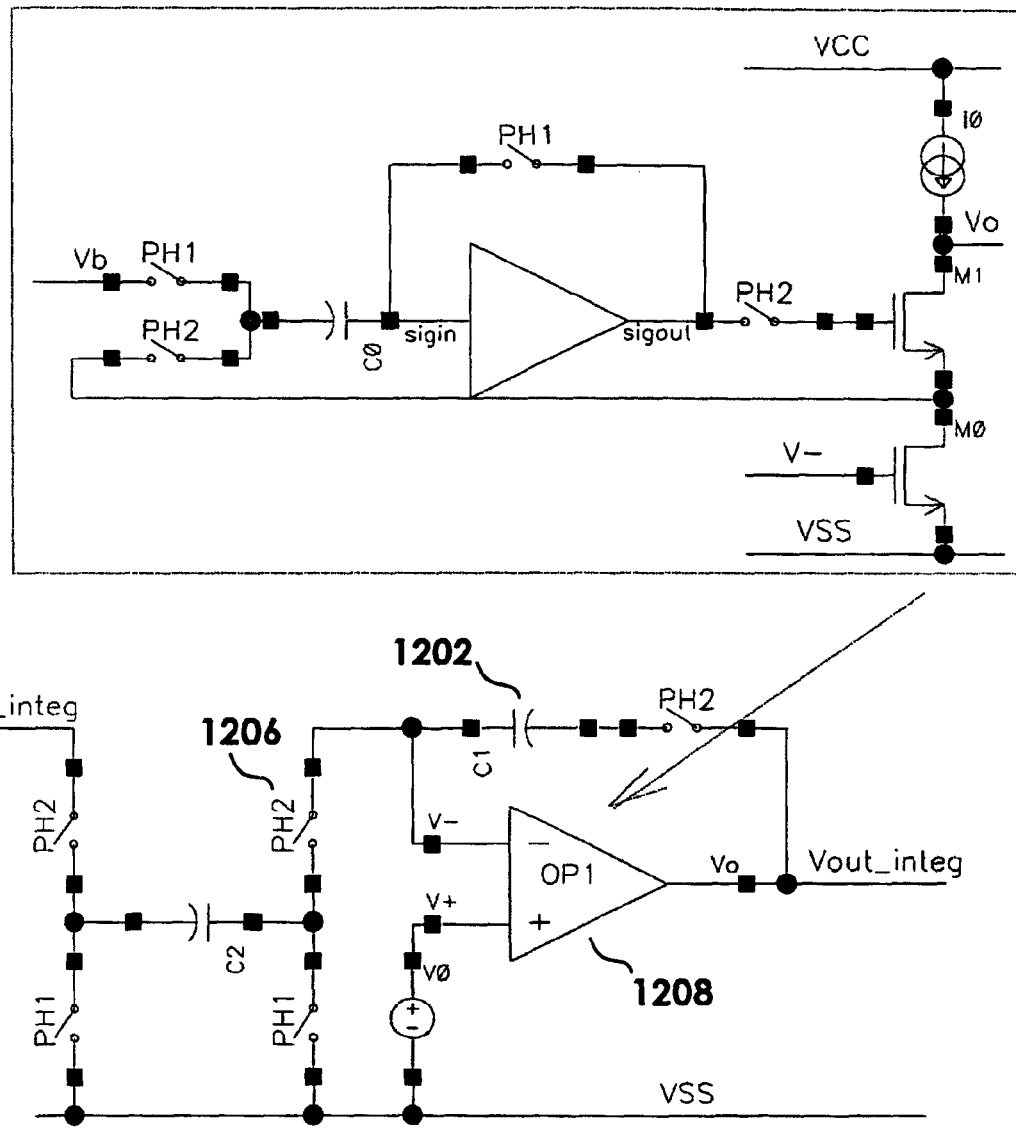
Figure 12. An application example for analog integrator circuit.

CAPACITOR GAIN-BOOST CIRCUIT

FIELD OF THE INVENTION

The present invention relates generally to integrated circuits and more specifically to analog amplifier circuits.

BACKGROUND OF THE INVENTION

The invention relates to analog amplifiers. Since the introduction of transistors and integrated circuits, analog amplifiers have been used in many applications Example applications range from video processing, audio processing, radio-frequency circuits, networking and sensor related fields. Amplifiers are often the fundamental building block of many analog systems. These systems include signal amplification, digital-to-analog converter, analog-to-digital converter, output drivers and sensor interfacing circuits, and they require amplifiers.

In these systems or applications, the overall performance is highly dependent on the performance capability of the individual amplifiers. Often, the system performance is limited by the amplifiers. Therefore, it is important to maximize the amplifier performance, and one of the critical performance factors is the gain.

Various amplifier designs have been developed in an attempt to meet high performance requirements. These include folded-cascode amplifiers, which are known in the art, and need not be described here. The closest prior art is thought to be represented by U.S. Pat. No. 6,362,688, and U.S. Pat. No. 6,828,856, both disclose prior gain boosting circuitry. Yet, such designs have not been addressing the increasing demand for high performance with flexible operating supply voltages and biasing conditions. Thus there is a need for a gain-boosting amplifier that requires simple configuration and offers wide range of supply voltage and biasing condition. The present invention addresses such a need.

SUMMARY OF THE INVENTION

A circuit is disclosed that comprises capacitor gain-boosting circuit and an amplifier coupled to a capacitor gain-boosting circuit. The gain-boosting circuit consists of amplifier and capacitor.

One advantage of a preferred embodiment of the present invention is that it performs with a high gain in comparison to existing amplifier circuits. Another advantage of a preferred embodiment of the present invention is that it is suitable to operate in many conditions, one example is wide supply voltage range.

Other objects, features, and advantages of the present invention will become apparent to one skilled in the art upon examination of the following drawings and detailed description. It is intended that all such additional objects, features, and advantages be included herein within the scope of the present invention.

BRIEF DESCRIPTION OF THE DRAWINGS

FIG. 1 illustrates a single-stage amplifier.

FIG. 2 shows a capacitor gain-boost circuit.

FIG. 3 shows capacitor gain-boost circuits implemented on complementary p-channel and n-channel amplifier.

FIG. 4 shows a capacitor gain-boost circuit with bias circuit.

FIG. 5 shows a dual-capacitor gain-boost circuit.

FIG. 6 shows a dual-capacitor gain-boost circuit with bias circuit.

FIG. 7 shows a switched-capacitor gain-boost circuit.

FIG. 8 shows an example implementation of gain-boost circuit.

FIG. 9 shows a gain-boost circuit in a p-channel amplifier arrangement.

FIG. 10 shows a capacitive MEMS sensor electrical equivalent model.

FIG. 11 shows an application example for capacitive MEMS interface circuit.

FIG. 12 shows an application example for analog integrator circuit.

DETAILED DESCRIPTION OF THE PREFERRED EMBODIMENTS

The present invention relates generally to integrated circuits and more specifically to analog amplifier circuits utilized in such circuits. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

A capacitor gain-boost circuit applied to an analog amplifier is disclosed. The capacitor gain-boost circuit can be configured to increase the gain of the amplifier. To describe the features of the present invention in more detail, refer now to the following description in conjunction with the accompanying Figures.

FIG. 1 shows an ordinary single-stage n-channel analog amplifier, its input is Vin and its output is Vout. It has an n-channel transistor 102 and a current source 104. The voltage gain of this amplifier 100, can be expressed as: $A=g_m r_o$, where $g_m$ is the transconductance of 102, and $r_o$ is the parallel output resistance of 102 and 104.

The capacitor gain-boosting circuit is shown in FIG. 2. It employs an additional n-channel transistor 204, a negative gain amplifier 206 and a capacitor 202. The output of amplifier 206 connects to the Gate of 204. The input of amplifier 206 is coupled to the source of 204 through capacitor 202. A gain-boost feedback loop is formed. Amplifier 206 continuously regulates the gate of transistor 204 such that the source of transistor 204 is maintained constant. The total effective gain of this amplifier can be simplified and approximated as: $A_{total}=A_{original}*A_{boost}$, where $A_{total}$ is the new gain using the gain-boost circuit, $A_{original}$ is the voltage gain of the original amplifier 100 shown in FIG. 1, and $A_{boost}$ is the gain of the gain-boost amplifier 206.

The capacitor gain-boost circuit allows a fully adjustable bias voltage for both amplifier 206 and transistor 204. This gives the design flexibility for component selection and operating region, which in turn may offer high frequency bandwidth, fast settling time and small IC silicon area. The operating supply voltage can also be minimal by setting the suitable bias voltage. As a result, it is able to operate in a low supply voltage system.

FIG. 3 shows capacitor gain-boost circuits apply to a complementary push-pull amplifier. In this circuit, a second capacitor gain-boost circuit is used, which consists of a negative gain amplifier 308, a capacitor 306 and a p-channel transistor 304.

FIG. 4 illustrates a capacitor gain-boost circuit with an established bias condition. Resistor 402 is connected between the input and output of amplifier 206. A bias condition is established for the input of amplifier 206. The bias voltage is stored and memorized in capacitor 202. This is an illustrative example, and one of ordinary skill in the art readily recognizes the bias network theory and may be modified for different applications.

FIG. 5 shows a dual-capacitor gain-boost circuit. A second capacitor 502 is coupled between the output of amplifier 206 and the gate of transistor 204. In this scheme, the output of amplifier 206 can be independently biased and is level shifted to connect to the gate of transistor 204. This allows optimal bias and operating points for multiple components simultaneously.

FIG. 6 illustrates a dual-capacitor gain-boost circuit in a bias condition. Resistor 602 provides the bias operating point for the gate of transistor 204. The bias voltage is stored and memorized in capacitor 502. This is an illustrative example, and one of ordinary skill in the art readily recognizes the bias network theory and may be modified for different applications.

FIG. 7 illustrates a switched-capacitor gain-boost circuit. Four switches (702, 704, 706 and 708) are added to the circuit. There are two clock phases: Initialization phase (PH1), and Amplification phase (PH2). During the initialization phase (PH1), switch 702 and switch 706 are closed, and switch 704 and switch 708 are open. The output and input of amplifier 206 are connected together in an auto-zero configuration to establish the bias operating point. The bias voltage is stored and memorized in capacitor 202. During the amplification phase (PH2), switch 704 and switch 708 are closed, and switch 702 and 706 are open. The gain-boost feedback loop is formed. Amplifier 206 continuously regulates the gate of transistor 204 such that its source voltage is maintained at a virtual constant level. The bias voltage can be set at any level thus the drain voltage of transistor 102 can be regulated to any desired voltage level.

FIG. 8 shows an implementation of the gain-boost amplifier 206. A single-input single-output amplifier is shown as an example. It consists of an n-channel transistor 802 and a constant current source 804. This amplifier circuit offers low power consumption. One of ordinary skill in the art readily recognizes this gain-boost amplifier 206, and that many alternative circuit approaches can be used, such as differential input amplifier architecture.

FIG. 9 illustrates a switched-capacitor gain-boost circuit applies to a p-channel amplifier. In this example, the same gain-boost amplifier 206 is used, or it can be modified to meet different needs.

The gain-boost circuit can be employed in different analog or mixed-mode designs. To illustrate its application usage, a few examples, but not limited to these examples, are demonstrated below.

Application Example I: MEMS sensor interface circuit. MEMS sensors can be used to measure pressure, motion, acceleration, magnetic field or temperature etc. For a capacitive type MEMS sensor, its electrical equivalent model can be shown as FIG. 10. In this model, there are three terminals and two discrete capacitors: 1002 and 1004. When the input stimulus changes (such as pressure, acceleration or temperature), the values of capacitors 1002 and 1004 change accordingly. By measuring the capacitance difference between 1002 and 1004, the input stimulus can be interpreted.

An analog interface with amplification circuit is used to convert the MEMS sensor's output into a usable electrical signal. An example MEMS interface circuit is shown in FIG. 11. The amplifier 1102 requires a high voltage gain for this application. A capacitor gain-boost circuit is used in amplifier 1102 to improve its gain. The operation can be described as follows. There are two clock phases: PH1 and PH2. During PH1, both capacitors 1002 and 1004 are shorted together. At the same time, the bias voltage is also set up for gain-boost amplifier 206 and stored in capacitor 202. During PH2, one of the terminals of capacitor 1002 is connected to ground. The switched-capacitor gain-boost circuit is also formed. The change in the output voltage reflects the changes in capacitors 1002 and 1004. The output has a direct relation to the input stimulus.

Application Example II: Voltage Integrator. The second application example is an analog voltage integrator. FIG. 12 shows a first-order active integrator. Capacitor 1202 is the integration capacitor. Capacitor 1206 is the switched-capacitor equivalent integration resistor. An operational amplifier 1208 is also used. The input and output of the integrator are Vin_integ and Vout_integ, respectively. For the purpose of illustration, a single-stage gain-boost circuit is used for operational amplifier 1208. It is understood by one of ordinary skill in the art that, it is a charge transfer amplifier circuit, and other types of charge transfer circuit may possibly be used, and that would be within the spirit and scope of the present invention.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the invention.

What is claimed is:

1. A circuit comprising:
   a) capacitor gain-boost circuit;
   b) main amplifier coupled with the capacitor gain-boost circuit;
   c) the capacitor gain-boost circuit comprised of a capacitor, a gain-boost amplifier, a cascode transistor, and a biasing circuit, wherein the capacitor is connected between the source of the cascade transistor and the input of the gain-boost amplifier, wherein the output of the gain-boost amplifier is connected to the gate of the cascode transistor, wherein the biasing circuit producing a bias potential to the input of gain-boost amplifier;
   d) the cascode transistor of the capacitor gain-boost circuit is coupled to the main amplifier;
   e) wherein the capacitor gain-boost circuit comprises one or a plurality of capacitor gain-boost circuits.

2. The circuit of claim 1 wherein the main amplifier is a single-input single-output amplifier.

3. The circuit of claim 1 wherein the main amplifier is a differential-input single-output amplifier.

4. The circuit of claim 1 wherein the main amplifier is a differential-input differential-output amplifier.

5. The circuit of claim 1 wherein the capacitor gain-boost circuit comprises a single capacitor gain-boost circuit.

6. The circuit of claim 1 wherein the gain-boost amplifier is a voltage amplifier.

7. The circuit of claim 1 wherein the gain-boost amplifier is a current amplifier.

8. The circuit of claim 1 wherein the gain-boost amplifier is a single-input single-output, differential-input single-output or differential-input differential-output amplifier.

9. The circuit of claim 1 wherein the capacitor gain-boost circuit comprises a plurality of capacitors and biasing circuits, wherein the plurality of capacitors is coupled to the inputs and outputs of the gain-boost amplifier, wherein the plurality of biasing circuits produces bias potentials for the capacitors.

10. The circuit of claim 1 including a single or a plurality of switches, wherein the switches connect with the gain-boost amplifier, capacitor and/or cascode transistor, wherein the switches work together with the biasing circuits.

11. A method of operating an amplifier circuit, the method comprising:
boosting the gain of an amplifier by,
   a) coupling a drain of a cascode transistor to a current source circuit or other circuit, and coupling a source of the cascode transistor to a drain of an amplifier transistor;
   b) driving a gate of the cascode transistor by means of a gain-boost amplifier, in series with a single or a plurality of capacitors, and/or a single or a plurality of switches for the purpose of setting the operating point, wherein this accomplishes the function of increasing the output impedance of the amplifier circuit.

* * * * *